(12) United States Patent
Fiering et al.

(10) Patent No.: US 12,280,398 B2
(45) Date of Patent: Apr. 22, 2025

(54) ACTUATION OF MICROCHANNELS FOR OPTIMIZED ACOUSTOPHORESIS

(71) Applicant: The Charles Stark Draper Laboratory, Inc., Cambridge, MA (US)

(72) Inventors: Jason Fiering, Boston, MA (US); Rebecca Christianson, Southborough, MA (US)

(73) Assignee: The Charles Stark Draper Laboratory, Inc.

( * ) Notice: Subject to any disclaimer, the term of this patent is extended or adjusted under 35 U.S.C. 154(b) by 967 days.

(21) Appl. No.: 17/193,485

(22) Filed: Mar. 5, 2021

(65) Prior Publication Data

US 2022/0280973 A1 Sep. 8, 2022

(51) Int. Cl.
*B06B 1/06* (2006.01)
*B81B 1/00* (2006.01)

(52) U.S. Cl.
CPC .................. *B06B 1/06* (2013.01); *B81B 1/00* (2013.01); *B81B 2201/032* (2013.01); *B81B 2201/058* (2013.01)

(58) Field of Classification Search
None
See application file for complete search history.

(56) References Cited

U.S. PATENT DOCUMENTS

| 2004/0069717 | A1 | 4/2004 | Laurell et al. | |
|---|---|---|---|---|
| 2014/0008210 | A1* | 1/2014 | Guia | G01N 33/491 204/518 |
| 2018/0369815 | A1 | 12/2018 | Zheng et al. | |
| 2020/0316601 | A1* | 10/2020 | Dubay | B01L 3/502715 |

FOREIGN PATENT DOCUMENTS

| CN | 107649191 A | 2/2018 |
|---|---|---|
| EP | 3 437 740 A1 | 2/2019 |
| EP | 3 718 634 A1 | 10/2020 |
| WO | WO-2018/200652 A1 | 11/2018 |

OTHER PUBLICATIONS

International Preliminary Report on Patentability on PCT Appl. Ser. No. PCT/US2022/018934 dated Sep. 14, 2023 (8 pages).
International Search Report and Written Opinion on PCT Appln. PCT/US2022/018934 dated Jun. 21, 2022 (100 pages).
Office Action issued in corresponding European Patent Application No. 22712171.2 dated Feb. 20, 2025.

* cited by examiner

Primary Examiner — Krishnan S Menon
(74) Attorney, Agent, or Firm — Foley & Lardner LLP

(57) ABSTRACT

The systems and methods of the present disclosure provide techniques for the design and use of an intermediate or transitional plate or block designed to couple acoustic energy at a given frequency from a transducer, such as a piezoelectric transducer, to one or more acoustophoretic devices, such as microfluidic channels, such that driving the chip occurs with a controlled wavelength and symmetry. Such techniques provide improved efficiency when driving a single acoustophoretic device, or for multiple acoustophoretic devices to be operated in concert from a single transducer, and therefore without complex electronics. Additionally, the techniques described herein allow for relaxed design constraints when considering transducer selection and fabrication, instead transferring design constraints to the more easily customized actuation plate.

20 Claims, 8 Drawing Sheets

ACTUATION OF MICROCHANNELS FOR OPTIMIZED ACOUSTOPHORESIS

BACKGROUND

Acoustophoresis can be used to move and manipulate small particles suspended in fluid through the application of acoustic energy. Some acoustophoresis systems employ two or more transducers coupled directly to an acoustophoresis channel and are driven out of phase. However, this can result in complicated electronics systems and unwanted secondary oscillations, especially when driving multiple channels.

SUMMARY

The systems and methods of this technical solution address these issues by providing an actuation device, or plate, which can include a single plate or series of beams, having a well-defined mechanical resonance with desired symmetry and frequency. This resonance is excited using a piezoelectric actuator coupled to the plate, and the plate in turn drives the acoustic stimulation of the acoustophoresis chip(s), which can include one or more microfluidic channels. The standing wave generated in the plate by the piezoelectric actuator can be tuned to match in scale to a desired number of microfluidic channels. Further, the systems and methods described herein can separate the chip design (e.g., the design characteristics of the channels themselves) from the design considerations of the piezoelectric element, allowing greater flexibility and ability to optimize.

At least one aspect of the present disclosure is directed to an actuation plate for acoustic acoustophoresis devices. The actuation plate can include a first surface configured to be coupled to an acoustic transducer. The actuation plate can include a second surface, opposite the first surface, configured to be coupled to a one or more microfluidic channels. The actuation plate can have a thickness selected such that the acoustic transducer generates a standing wave in the actuation plate that concurrently focuses target particles to flow within fluid along a center of each of the one or more microfluidic channels.

In some implementations, the second surface of the actuation plate can include one or more grooves or slots along a length of the actuation plate. In some implementations the actuation plate can include one or more grooves or slots along a width of the actuation plate. The one or more grooves or slots can define one or more beams. Each of the one or more beams can have a width less than or comparable to the wavelength of the standing wave in the actuation plate. In some implementations, the actuation plate can include at least one of a composite material, aluminum, steel, brass, tungsten, ceramic, or silicon. In some implementations, the actuation plate can be constructed from a material having a first elastic modulus. In some implementations, the one or more microfluidic channels can be constructed from a second material having a second elastic modulus. In some implementations, the second elastic modulus can be different from the first elastic modulus.

In some implementations the wavelength of the standing wave in the actuation plate can further depend on the first elastic modulus of the material. In some implementations, the material of the actuation plate can be selected such that the wavelength of the standing wave in the actuation plate has a number of standing wave nodes or a number of standing wave antinodes that correspond to a number of the one or more microfluidic channels. In some implementations, the width of the actuation plate and the thickness of the actuation plate are selected such that the wavelength of the standing wave is large enough to accommodate each of the one or more microfluidic channels to be positioned on a center of a respective one of the one or more standing wave nodes in the actuation plate.

In some implementations, the actuation plate can have a first elastic modulus along a first axis corresponding to the width of the actuation plate, and a second elastic modulus along a second axis corresponding to a length of the actuation plate. In some implementations, the actuation plate can have a width selected such that the standing wave in the actuation plate caused by the acoustic transducer has a plurality of standing wave nodes that each correspond to the positions one or more microfluidic channels. In some implementations, the actuation plate can have a width selected such that a standing wave in the actuation plate caused by the acoustic transducer has a plurality of standing wave nodes that each correspond to a respective one of the one or more microfluidic channels. In some implementations, the second surface of the actuation plate can be configured to decouple from the plurality of microfluidic channels.

At least one other aspect of the present disclosure is directed to a method of creating actuation plates for acoustophoresis devices. The method can include identifying a desired frequency for an acoustophoresis system. The method can include selecting a width for an actuation plate, a thickness of the actuation plate, and a material for the actuation plate having a first elastic modulus. The thickness can be selected such that the acoustic transducer generates a standing wave in the actuation plate that concurrently focuses target particles to flow within fluid along a center of one or more microfluidic channels. The width can be selected such that a standing wave in the actuation plate caused by the acoustic transducer has one or more standing wave nodes or antinodes that each correspond to a respective positions of one of the one or more microfluidic channels. The method can include coupling the acoustic transducer to a first surface of the actuation plate, and coupling the one or more microfluidic channels to a second surface of the actuation plate, the second surface opposite the first surface.

In some implementations, the method can include flowing a fluid comprising target particles through at least one of the one or more microfluidic channels coupled to the actuation plate. In some implementations, the method can include generating the standing wave in the actuation plate by actuating the acoustic transducer at the desired frequency. In some implementations, the method can include defining one or more grooves or slots in the second surface of the actuation plate through the plate prior to coupling the one or more microfluidic channels to the actuation plate.

In some implementations, the method can include determining a dispersion relation for vibrations in the actuation plate. In some implementations, the method can include selecting the material for the actuation plate such that a density of the actuation plate, an elastic modulus of the actuation plate, and a Poisson ratio of the actuation plate satisfy the dispersion relation for the vibrations in the actuation plate. In some implementations, the method can include determining a number of microfluidic channels for a microfluidic device. In some implementations, the method can include determining a wavelength of the standing wave in the actuation plate based on the number of microfluidic channels. In some implementations, the dispersion relation for the vibrations in the actuation plate is used to relate material properties and dimensions of the actuation plate to the wavelength of the standing wave. In some implementations, the method can include decoupling the plurality of microfluidic channels from the second surface of the actuation plate.

In some implementations, the method can include positioning the one or more microfluidic channels such that each of the one or more microfluidic channels are positioned on a center of a corresponding one of the one or more standing wave nodes or antinodes generated in the actuation plate by the acoustic transducer. In some implementations, the method can include positioning the acoustic transducer at a center of the actuation plate.

At least one other aspect of the present disclosure is directed to a system. The system can include an acoustic transducer. The system can include one or more microfluidic channels. The system can include an actuation plate. The actuation plate can include a first surface coupled to the acoustic transducer and a second surface coupled to the one or more microfluidic channels, the second surface opposite the first surface. The actuation plate can have a thickness selected such that the acoustic transducer generates a standing wave in the actuation plate that concurrently focuses target particles to flow within fluid along a center of each of the one or more microfluidic channels.

In some implementations, each of the one or more microfluidic channels can have a width that is less than or comparable to half the wavelength of the standing wave in the actuation plate. In some implementations, each of the one or more microfluidic channels can be positioned on a center of a respective one of the one or more standing wave nodes in the actuation plate. In some implementations, each of the one or more microfluidic channels can comprise an inlet, and are configured to receive a fluid comprising target particles via the inlet. In some implementations, the acoustic transducer is configured to impart the standing wave in the one or more microfluidic channels.

In some implementations, the acoustic transducer is secured to a center of the first surface of the actuation plate. In some implementations, the actuation plate is constructed from a uniaxial composite material such that the actuation plate has a first elastic modulus along a first axis corresponding to the width of the actuation plate, and a second elastic modulus along a second axis corresponding to a length of the actuation plate. In some implementations, the actuation plate has a width selected such that the standing wave in the actuation plate generated by the acoustic transducer has a plurality of nodes that each correspond to a respective one of the plurality of microfluidic channels. In some implementations, the actuation plate and the plurality of microfluidic channels are each configured such that the plurality of microfluidic channels can be decoupled from the actuation plate.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. The foregoing and other objects, aspects, features, and advantages of the disclosure will become more apparent and better understood by referring to the following description taken in conjunction with the accompanying drawings, in which.

DETAILED DESCRIPTION

Figure 1:
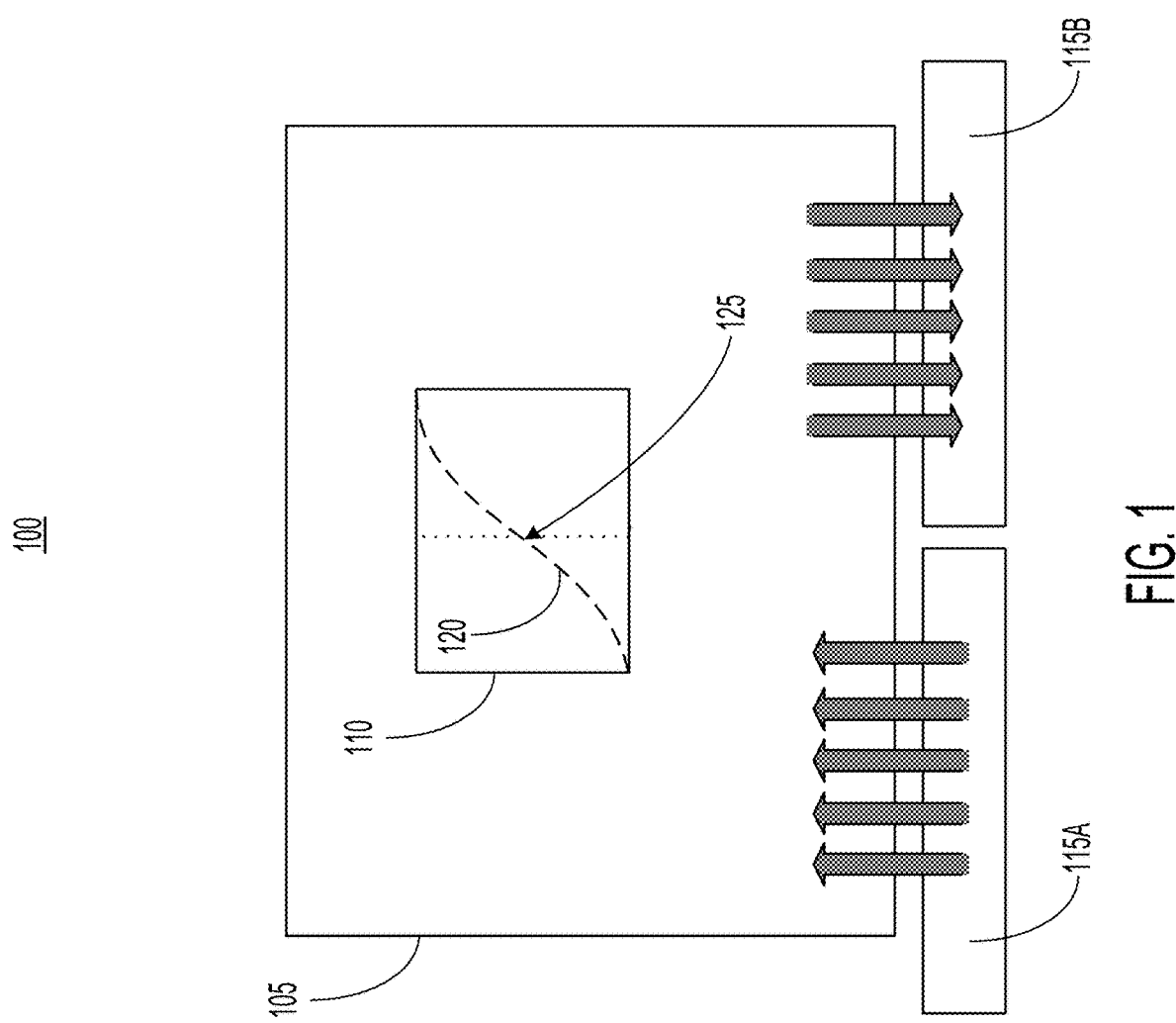
FIG. 1 illustrates a cross-sectional view of an example acoustophoresis system using two acoustic transducers, in accordance with one or more implementations or a single conjoined transducer with three or more electrodes on the transducer.

The various concepts introduced above and discussed in greater detail below may be implemented in any of numerous ways, as the described concepts are not limited to any particular manner of implementation. Examples of specific implementations and applications are provided primarily for illustrative purposes.

The present disclosure describes systems and methods for an actuation plate, sometimes referred to herein as a plate, which can be used to optimize driving of acoustophoresis channels. In particular, the technology described herein describes systems, methods, and devices that improve the efficiency and throughput of acoustophoresis devices having multiple channels. Conventional acoustophoresis devices often include one or more acoustic transducers per channel, which when scaled often require complex electronics and driving schemes. Multiple acoustic transducers often need complicated electronics systems because the vibrations of the transducers must be synchronized to achieve desired results (e.g., driven out of phase, etc.). Alternately, conventional acoustophoresis devices often include one continuous transducer coupled to multiple microfluidic channels, requiring that the transducer be at least as large as the array of microfluidic channels. Such transducers require undesirably large electrical power to operate as size increases.

The systems and methods described herein provide an actuation plate that is particularly tuned such that a frequency of a standing wave induced in the plate by a single acoustic transducer is about equal to a resonant frequency of one or more microfluidic channels secured to the plate.

Tuning the physical parameters of the plate, such as material type (e.g., having a known elastic modulus, etc.), plate thickness, plate width, and plate length, allows for precise tuning of the parameters of the standing wave in the plate to drive multiple channels. For example, by altering the width, thickness, and elastic modulus of the plate, the number of standing wave nodes, and the distance between the standing wave nodes, can be adjusted. A microfluidic channel can be placed on the surface of the plate, such that the channel is centered on one of the standing wave nodes. Generating a standing wave in a plate that has many nodes allows a single acoustic transducer to efficiently drive many microfluidic channels without requiring complex electronics or precise multi-transducer tuning.

In other implementations, the acoustic driving of bulk wave acoustophoresis systems is often accomplished by directly coupling one or more piezoelectric transducers through a thin solid or fluid layer directly to the microfluidic chip in which the cells or particles are suspended. This couples the face, or surface, of the chip directly to the surface vibration mode of the transducer. Some implementations may require specific transducer geometry to achieve the desired oscillations in the chip at the required frequency. Several other implementations have taken to employing two or more transducers coupled directly to the acoustophoretic channel and driven out-of-phase to provide the appropriate transverse symmetry for acoustophoresis, similar to the arrangement depicted in FIG. 1.

However, this can result in complicated electronics systems, especially when driving of multiple channels simultaneously is desired. Moreover, this places specific constraints on transducer design, which ultimately could increase manufacturing costs and limit supply in commercial production. Additionally, there can be poor control or selection of the longitudinal driving mode with this system. The longitudinal mode (the shape of the acoustic wave along the length of the microfluidic channel or chamber) can affect the cumulative efficiency of the device. An example of an acoustophoresis system that utilizes two or more transducers driven out of phase is described herein below in conjunction with FIG. 1. Some example applications of acoustophoresis systems include washing, concentration, separation, and particle positioning, among others.

The particular design requirements of the plate (e.g., the selected width, thickness, length, and material type, etc.) according to the equations described herein, are important, because any deviation from said design requirements could nullify any potential benefit conferred by the driving plate. For example, simply using any size plate, of an arbitrary material, would likely reduce the overall efficiency of the system, or render it inoperable, because the plate is not exactly tuned to a resonant frequency of the chip (or other microfluidic device) that is secured to the plate. Further, absent the design considerations described herein, the properties of a standing wave generated in the plate, if any, would likely not have nodes or antinodes that are aligned with the center of the microfluidic channels, making acoustophoretic separation, or other acoustophoretic tasks, impossible. In the absence of these design constraints, an improperly designed plate would only serve to dampen the effects of a single transducer and fail to generate an appropriate standing wave in the plate to acoustically focus materials in the microfluidic channels. Thus, the systems and methods described herein provide particular design constraints that present non-obvious improvements and advantages over other acoustophoresis devices.

An example depiction of a less efficient, and more electronically complicated, acoustophoresis system having at least two transducers is shown in FIG. 1. Referring now to FIG. 1, depicted is a cross-sectional view of an example acoustophoresis system 100 that includes two acoustic transducers 115A and 115B (sometimes generally referred to as "the acoustic transducer(s) 115" or "the transducer(s) 115"), which are driven out of phase. The acoustophoresis system 100 can include a channel substrate 105. A microfluidic channel 110 can be defined, or formed, in the channel substrate. The floor of the channel substrate 105 can be coupled with one or more acoustic transducers 105, which can be, for example, piezoelectric transducers. The arrows suggest the approximate direction of actuation in one phase of the oscillation, with one surface of substrate 110 driven away from the initial position of the transducer 115 while another surface of substrate 110 is driven toward the initial position of transducer 115.

The wall or portion of material separating the channel substrate 105 from the transducers 115 can be referred to as the "floor" of the microfluidic channel. The "ceiling" can be the wall opposite the floor. The channel substrate 105 can be secured to one or more of the transducers 105, by a coupling adhesive, a fluid, or a mechanical clamp. In some implementations, the coupling adhesive can be cyanoacrylate glue. By way of example, without limitation, the transducers 115 can be operated at a frequency between about 0.1 MHz and about 5 MHz. In some implementations, the frequency of the transducers can be driven out of phase. As depicted, the transducer 115A is driven 180 degrees out of phase with the transducer 115B.

The channel substrate 105 of the acoustophoresis system 100 can be manufactured from one or more portions of a substrate sheet. The substrate sheet can be made of, without limitation, any type of polystyrene, glass, polyimide, acrylic, polysulfone, thermoplastic, thermoset polymers, silicon, or any combination thereof. Some example thermoplastic materials can include polystyrene, acrylic (polymethylmethacrylate), polysulfone, polycarbonate, polyethylene, polypropylene, cyclic olefin copolymer, silicone, liquid crystal polymer, polyimide, polyetherimide, and polyvinylidene fluoride. The microfluidic channel 110 can be manufactured by a number of manufacturing techniques, including, but not limited to, milling, molding, embossing, etching, or any combination thereof. The microfluidic channel can be formed by creating the channel in a top (or bottom) portion of the channel substrate 105 sheet, and coupling a bottom (or top portion, as the case may be) portion of the substrate sheet to the other portion to form the enclosed microfluidic channel 110 in the substrate sheet 105.

The portions of the substrate can be coupled using any suitable coupling technique, such as thermocompression, mechanical clamping, adhesive bonding (e.g., using cyanoacrylate glue, another type of adhesive, etc.), or plasma bonding, among others. In some implementations, multiple microfluidic channels 110 can be created in the channel substrate 105. In implementations similar to those depicted in FIG. 1, channel substrates 105 with more than one channel may utilize more than two transducers 115, which can increase the complexity and reduce the efficiency when compared to other techniques described herein. The dimensions of the channel substrate 105, and of the microfluidic channel 110, can be tuned based on the characteristics of the fluid undergoing acoustophoresis to have a certain resonant frequency.

The microfluidic channel 110 can be formed such that it can connect to other microfluidic features in a microfluidic system, such as inlets, outlets, reservoirs, chambers, fluidic capacitors, pumps, actuators, or other types of microfluidic features. In some implementations, the microfluidic channel 110 can include one or more inlets that receive fluid that flows through the microfluidic channel (e.g., containing target particles suspended in the fluid, etc.). The microfluidic channel 110 can include an outlet that couples to one or more other microfluidic features, such as an outlet port, a reservoir, a fluidic capacitor, or any other type of microfluidic feature. In some implementations, the microfluidic channel 110 can include one or more external connectors that receive or provide fluid to one or more external fluid systems. The connectors can attach, for example, to one or more external tubes or fluid transportation mechanisms that can transport fluid between microfluidic systems.

Figure 5:
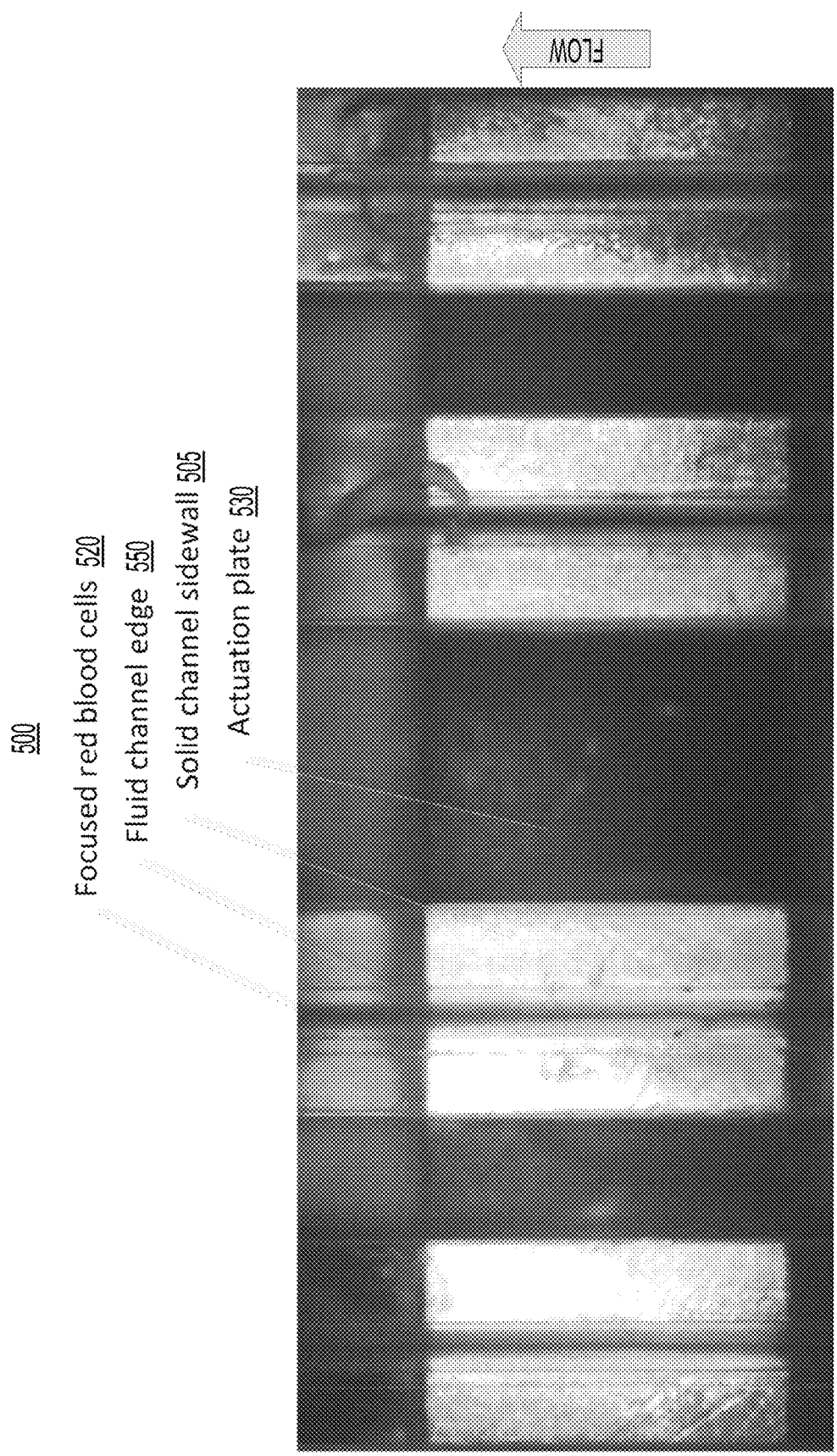
FIG. 5 illustrates a micrograph of a top view of a 4-channel microfluidic device mounted to a plate similar to the plates depicted in FIGS. 2-4, in accordance with one or more implementations.

An acoustic wave 120 generated by the transducers 115 (e.g., a single wave generated by the transducers precisely out of phase, etc.) can propagate through the channel substrate 105 and ultimately through the microfluidic channel 110. The acoustic wave 120, when generated in the fluid flowing through microfluidic channel 110, can be a standing pressure wave. This frequency can create a pressure node 125 in the center of the microfluidic channel 110. A pressure node is a node along a standing wave (e.g., of varying pressure, etc.) in the fluid flowing through the microfluidic channel 110 where the wave has a minimum amplitude about an origin line (e.g., indicated in FIG. 1 as a horizontal line bisecting the microfluidic channel 110, etc.). The pressure node causes certain target particles to be focused toward (i.e., displaced toward) the center of the channel along the pressure node, which can be leveraged for acoustophoresis techniques downstream in the channel. An example of such focusing, albeit using other, improved techniques described herein, is depicted in FIG. 5. However, because the acoustophoresis system 100 utilizes two or more transducers 115, it suffers from the drawbacks described herein.

Figure 2:
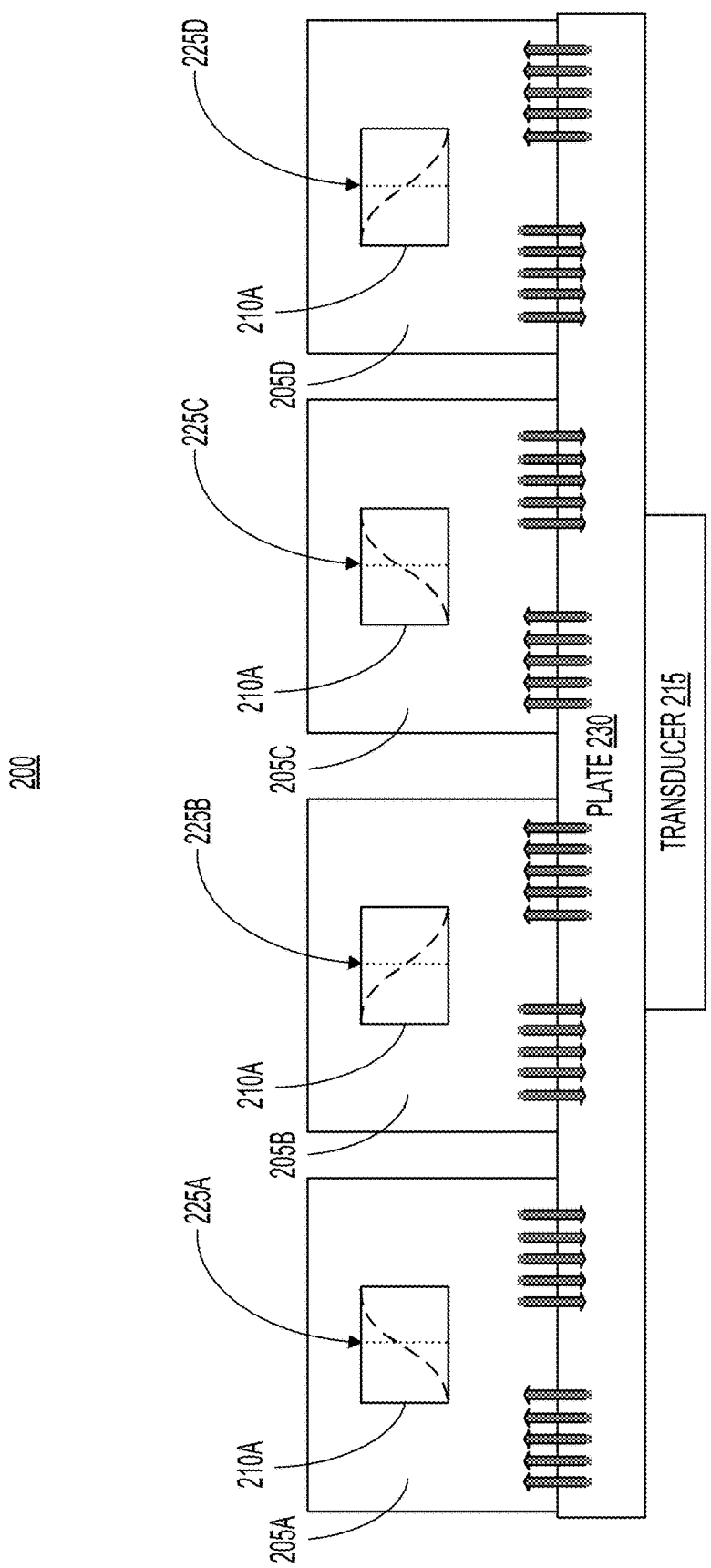
FIG. 2 illustrates a cross-sectional view of an example system including a plate that drives microfluidic devices, in accordance with one or more implementations.

Referring now to FIG. 2, depicted is cross-sectional view an example system 200 including a plate that drives microfluidic acoustophoresis devices, in accordance with one or more implementations. The system 200 addresses the deficiencies of the system 100 described herein above by using an intermediate or transitional plate 230 (sometimes referred to as a "block 230" or a "jig 230") designed to couple acoustic energy at a given frequency from a transducer 215 to one or more acoustophoretic devices (e.g., having one or more microfluidic channels, etc.) such that the driving of the one or more acoustophoretic devices occurs with a controlled wavelength and symmetry. This allows a single acoustophoretic device to be operated more effectively or multiple acoustophoretic devices to be operated in concert without complex electronics, and using a single transducer 215. Additionally, the design constraints on transducer 215 selection or design can be relaxed, instead shifting the design constraints to the more easily customized plate 230.

The system 200 can include one or more acoustophoresis devices 205A-205D (sometimes generally referred to as the "acoustophoresis device(s) 205" or the "chip(s) 205"), each having a corresponding channel 210A-210D (sometimes generally referred to as the "microfluidic channel(s) 210") defined therein. The acoustophoresis devices 205 can be similar to the acoustophoresis devices constructed from the channel substrate 105, having the microfluidic channel 110, as described herein above in conjunction with FIG. 1. The acoustophoresis devices 205 can be manufactured in a substantially similar manner to those described herein above in conjunction with FIG. 1, however instead of coupling directly to a transducer, the one or more microfluidic channels 205 are coupled to an actuation plate 230 (sometimes referred to herein as a "plate 230", a "block 230", or a "jig 230"). In some implementations, the each of the acoustophoresis devices 205 can be manufactured from at least one sheet of substrate material, and can be separated by air gaps. The air gaps can be voids in the substrates that define the acoustophoresis devices 205 that run along at least a portion of the length of the acoustophoresis devices 205. The air gaps can extend from the top acoustophoresis device 205 to a bottom portion of the acoustophoresis device 205. In some implementations, the acoustophoresis devices 205 can each be manufactured using different substrate sheets, and can each be secured on a surface of the plate 230 using a suitable attachment technique (e.g., adhesion, etc.). Each of the microfluidic channels 210 of the acoustophoresis devices 205 can be positioned on the plate 230 such that channels 210 are centered on a respective node of a standing wave generated in the plate 230 via the transducer 215. The microfluidic channels 210 can be similar to, and can include any of the properties of, the microfluidic channels 110 described herein above in conjunction with FIG. 1.

Figure 4:
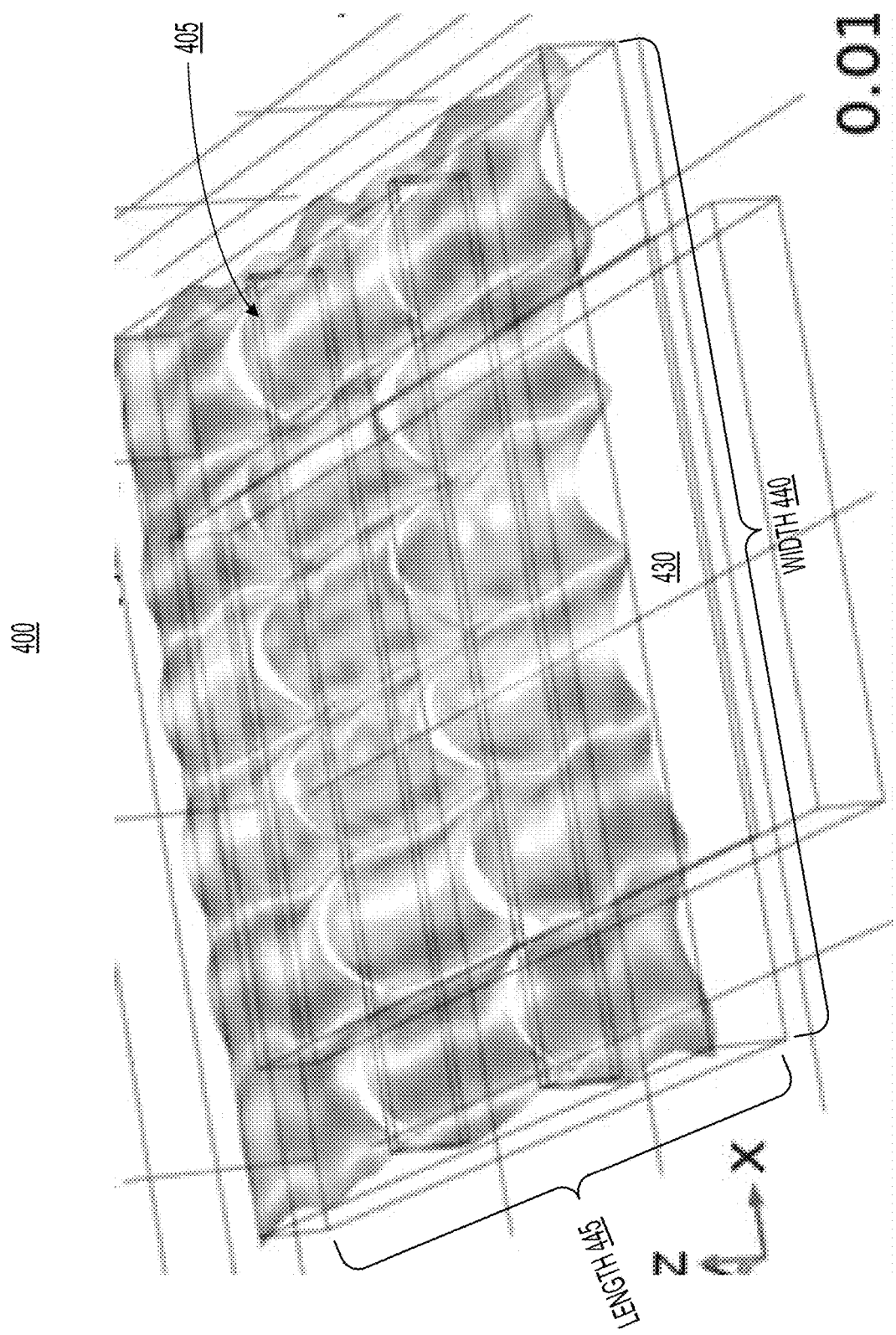
FIG. 4 illustrates example finite element results from a plate similar to the plates depicted in FIGS. 2 and 3, in accordance with one or more implementations.

The acoustophoresis devices 205 of the system 200 can be driven by a single transducer 215, rather than multiple transducers as depicted in FIG. 1. Using a single transducer design, rather than a multiple transducer design or a design that requires directly coupling an acoustophoresis device to the transducer, has a number of advantages. For example, one advantage is that the transducer can drive multiple acoustophoresis devices simultaneously in parallel. Another advantage is that by utilizing only one transducer, the complexity of the electronic driving circuits required for the acoustophoresis system 200 are simplified. Further, utilizing a plate 230 allows precise control of the longitudinal vibrational modes along the length of the microfluidic channel to achieve uniformity of acoustic actuation along the longitudinal direction. An example of a clean longitudinal waveform generated using similar techniques is depicted in FIG. 4.

As depicted in FIG. 2, the system 200 can include a plate 230, which can be manufactured from any suitable material, such as a metal (e.g., steel, aluminum, etc.), a composite material, a ceramic, or another type of material. In some implementations, the longitudinal mechanical mode of the plate 230 can be altered as desired (e.g., to get a clear waveform such as the waveform depicted in FIG. 4, etc.) by adding asymmetry to the plate through the inclusion of one or more slots or grooves. The slots or grooves can be defined in the plate 230 using any suitable technique, such as etching, milling, drilling, or cutting, among others. In some implementations, the plate 230 can be constructed to have a first elastic modulus along one direction of the plate 230 (e.g., widthwise, etc.), and another elastic modulus along a second direction of the plate (e.g., lengthwise, etc.). The plate 230 can be constructed to have a well-defined mechanical resonance with the desired symmetry and frequency for a standing wave in the plate. This resonance is excited using the transducer 215, and in turn drives the acoustic stimulation of the microfluidic channels 210.

For example, to drive the four acoustophoresis devices 205A-205D, each designed to have an acoustic node 225A-225D (sometimes referred to as the "acoustic node(s) 225") at the chip center and at a frequency f, a rectangular plate 230 of appropriate material properties (e.g., elastic modulus, anisotropic properties, etc.) and geometry (e.g., width, length, thickness, etc.) can be designed to have a plate bending mode resonance at that frequency f and with a transverse wavelength equal to the spacing between the chips (e.g., the distance between each acoustic node 225, etc.). Each of the chips 205 can be coupled to the surface of the plate 230, such that each microfluidic channel 210 is aligned with the node positions in the standing acoustic wave in the plate 230. The standing acoustic wave can be driven by coupling the plate 230 to an appropriate transducer (e.g., a piezoelectric transducer, a bulk piezoelectric transducer, a lead zirconate titanate transducer, etc.) and mounting the chips 205 to the plate 230.

The longitudinal mechanical mode of the plate 230 can be altered as desired by adding asymmetry to the plate 230 through the inclusion of slots, grooves or anisotropic material properties (e.g., uniaxial composites, etc.). One advantage to creating slots in the plate 230, rather than in the transducer 215, is that slots and grooves are much more difficult, if not impossible, to fabricate in the transducer 215 itself than they are in a plate 230. For example, transducers 230 can be constructed from material having properties that make it difficult to define slots or grooves along its surface. The vibrational modes of the plate 230 can be affected by the dimensions of the plate 230, the selection of which are described in greater detail below in conjunction with FIG. 3.

Figure 3:
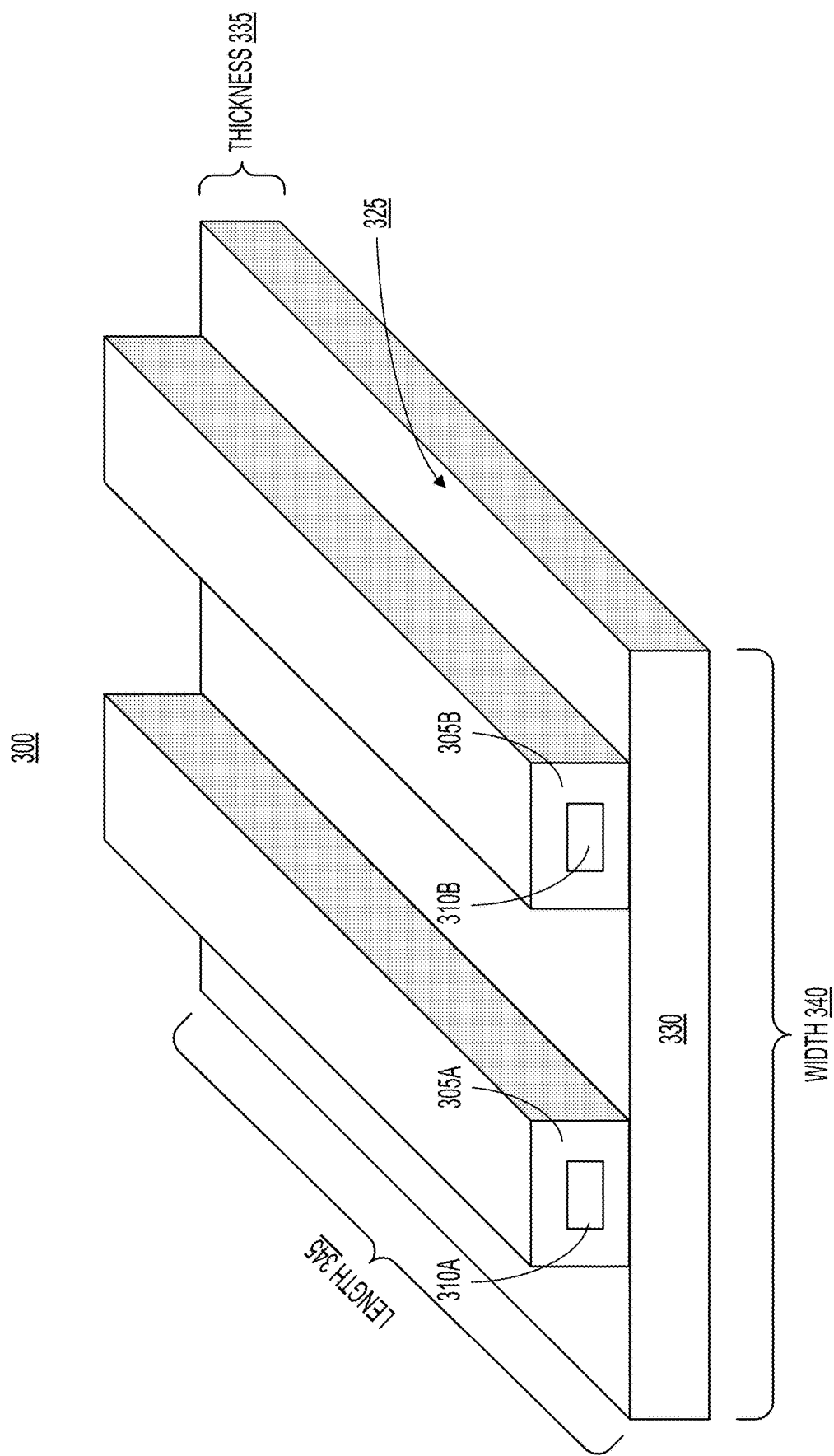
FIG. 3 illustrates a perspective view of a driving plate similar to the plate depicted in FIG. 2, in accordance with one or more implementations.

Referring now to FIG. 3, depicted is an example perspective view 300 of a driving plate 330 with acoustophoresis devices 305A and 305B (sometimes generally referred to as the "acoustophoresis device(s) 305") coupled thereto, similar to the plate 230 depicted in FIG. 2, in accordance with one or more implementations. Each of the acoustophoresis devices 305 can have a respective microfluidic channels 310A and 310B (sometimes generally referred to as the "microfluidic channel(s) 310"), which can be similar to and have all of the properties of the microfluidic channel 110 described herein above in conjunction with FIG. 1. In some implementations, the acoustophoresis devices 305 (and thus the microfluidic channels 310) can be coupled to the plate 330 using a connector. In such implementations, the acoustophoresis devices 305 can be decoupled from the plate 330. For example, the acoustophoresis devices 305 can be disposable, and thus removable from (and replaceable on) the plate 330 via the connector. The plate 330 can be constructed from a material that causes the plate 330 to have a desired elastic modulus along its width 340. The elastic modulus can be a measure of the stiffness of the material used to construct the plate 330. In general, the standing mode resonance of the plate 330, which can be tuned to a resonant frequency of the acoustophoresis devices 305, can be defined by a wavelength of the standing wave generated in the plate 330 by a transducer (not pictured). The thickness 335 of the plate 330 can be selected as a function of the desired wavelength of the standing wave generated in the plate 330 and of the stiffness (e.g., elastic modulus, etc.) of the plate 330. The frequency of the standing wave can be selected based on the resonant frequency of the channels 310 necessary to excite the appropriate symmetry of acoustic pressure. The plate can then be designed to optimally drive all channels 310 uniformly with this frequency and with the desired symmetry. The plate 330 is designed such that the channels can be centered on the nodes of the plate mode to achieve the desired odd symmetry of the resonant mode.

Equations for determining the useful resonant modes for the plates described herein, such as the plate 230 or the plate 330, are included below. For a rectangular plate, the dispersion relation (wavelength-frequency relation) for vibrations is given by:

$$\lambda^2 = \omega \sqrt{\frac{6\rho(1-v^2)}{2h^2 E}},$$

where $\rho$ is the density of the plate material, h is half the plate thickness (e.g., the plate thickness 335), E can be the elastic modulus of the plate material and $v$ is the Poisson ratio of the plate material. The Poisson ratio can be a measure of the Poisson effect, which is the phenomenon in which a material tends to expand in directions perpendicular to the direction of compression. The value of $\lambda$ can represent the wavelength of the standing-mode wave vibrations in the plate, and the value of $\omega$ can represent the frequency of the transducer to which the plate is coupled. In general, the standing mode resonances through the plate can be determined by the boundary conditions of the plate, and by the need for the displacement function of resonance to fulfill those boundary conditions. For simply supported boundary conditions (e.g., those which permit rotations but not displacements of the beam ends, etc.), the standing mode resonances can be determined by the frequencies at which a half-integer multiple of the wavelength fits within each transverse plate dimension. However, it should be understood that other boundary conditions, such as fixed boundary conditions or free boundary conditions, are possible. The support of the plate (or the beams, as the case may be) can be chosen to achieve a desired boundary condition.

As described herein above, the frequency of the transducer can be determined by the resonant frequency of the channels 310 (e.g., the microfluidic channels 210, etc.) necessary to excite the appropriate symmetry of acoustic pressure in the channel to carry out focusing of target particles within the fluids in the channels 310. The width 340 of the plate 330 can therefore be determined by calculating the wavelength of the standing mode wave in the plate 330 (e.g., calculated using the equation above, etc.), and identifying the number nodes of the standing wave that exist within the width of the plate 330 that can accommodate a desired number of microfluidic channels. An example design of a plate coupled to twelve microfluidic channels is described herein below in conjunction with FIG. 6. The plate 330 width 340 can be designed to accommodate a desired number of microfluidic channels 310, such that the width of the microfluidic channels 310 is less than half of the calculated wavelength of the standing wave in the plate 330. The acoustophoresis devices can be positioned such that each of the channels 310 are centered on the nodes of the standing wave vibrations in the plate 330 to achieve odd driving symmetry.

The above equation can describe characteristics for a uniform plate. If the plate has anisotropic mechanical properties, the wavelengths for a given frequency of excitation can be different for the different directions along the plate, a property which can be used to help control the longitudinal mode behavior of the channel resonances. The acoustophoresis process is improved when the nodes of the standing wave generated in the plate 330 are maintained in the center of each of the channels 310 along the length of the channels 310, and the pressure amplitudes along the length of the channel have minimum variation. A depiction of simulated data from a plate is described herein below in conjunction with FIG. 4.

Referring briefly now to FIG. 4, depicted is a view 400 of example finite element results from a simulation of a plate similar to the plates 230 and 330 depicted in FIGS. 2 and 3, respectively, in accordance with one or more implementations. The view 400 shows a simulated plate 430, which can be simulated to have similar properties to those described herein above in conjunction with the plates 230 and 330 of FIGS. 2 and 3. The simulated plate 430 has a width 440 and a length 445. The simulated waveform 405 is simulated data that represents the vibrational waveform (e.g., displacement perpendicular to the plate surface at one phase of the oscillation) that would be generated in a plate, such as the plate 230 or the plate 330, having a similar width, length, thickness, and material properties. The nodes of the standing wave indicated by the waveform 405 are substantially parallel, along the length of the plate 430. Furthermore, the waveform is substantially uniform in the length direction 445 as desired for efficient acoustophoresis. Microfluidic channels, such as the channels depicted in FIG. 5, can be coupled to a plate similar to that depicted in FIG. 4 such that the channels are centered on the nodes of the standing wave generated in the plate.

Figure 8:
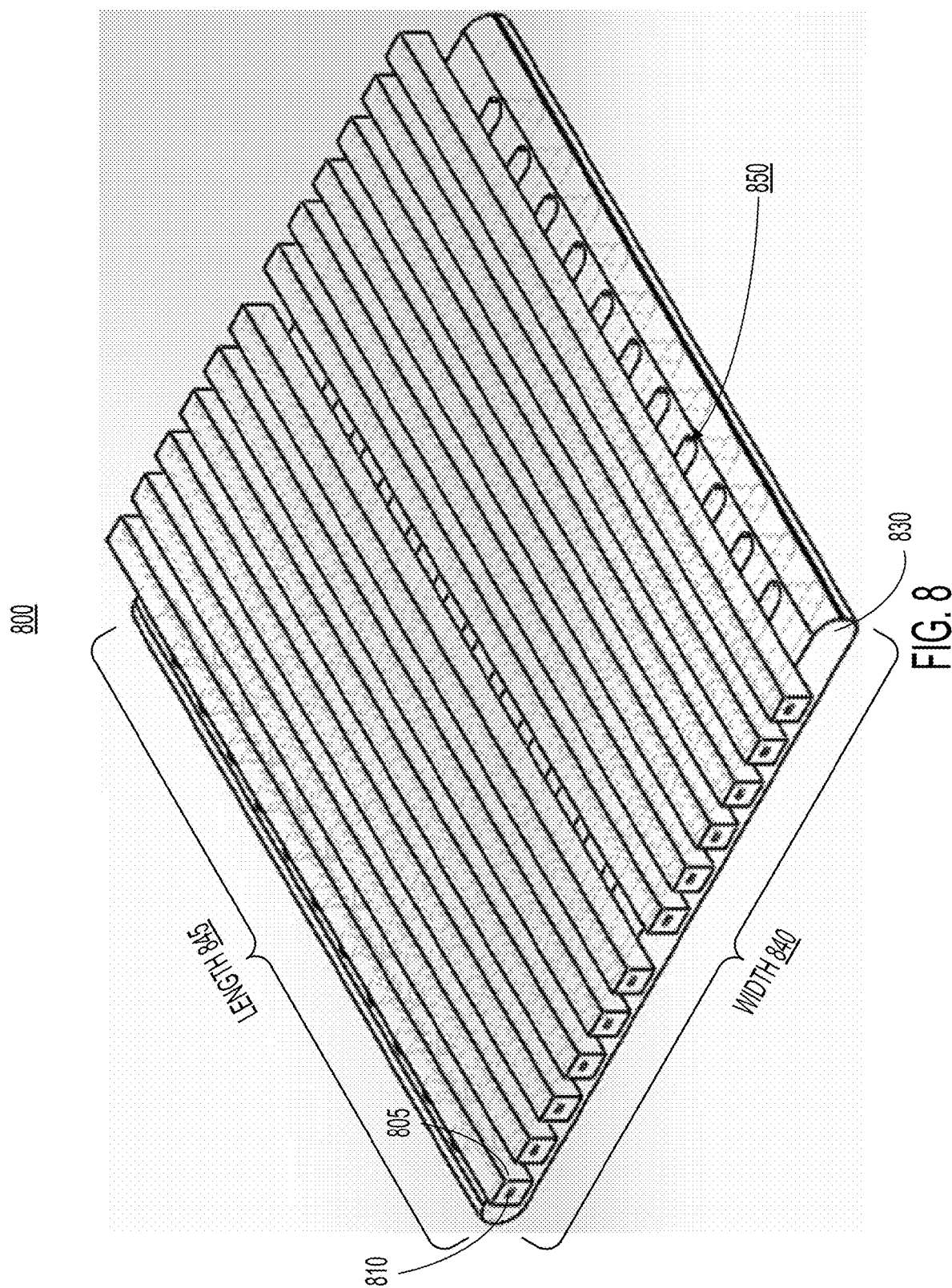
FIG. 8 illustrates an example design of an actuation plate having a number of slots defined therein, in accordance with one or more implementations.

Referring forward now to FIG. 8, depicted is a perspective view 800 of an example plate 830 that includes a number of slots 850. As shown, the slots 850 can be defined in the plate 830 such that they create openings in the top surface and the bottom surface of the plate 830 along the width 840 of the plate 830. In some implementations, the slots 850 can be grooves that are defined along the width 840 of the plate 830, and may not necessarily define openings in both surfaces of the plate 830. The slots or grooves can be used, for example, to efficiently suppress the longitudinal modes of the plate 830 that can arise if the plate has no slots 850 or grooves. As described herein, coupling the vibrations among the beams in the plate can result in a waveform similar to the waveform 405 described herein above in conjunction with FIG. 4.

The slots 850 or grooves can be formed in the plate 830 parallel to one another, and can be spaced relative to one another along the length 845 of the plate 830. The slots 850 or the grooves can define one or more rectangular portions of solid material which support the acoustophoresis devices 805 coupled to the plate 830. The acoustophoresis devices 805 can be similar the acoustophoresis devices 305 detailed herein above in connection with FIG. 3, and can include one or more microfluidic channels 810 defined therein. The parallel beams in the plate 830 can have dispersion relations similar to those described herein above. The beams defined by the slots 850 can form the surface of the plate 830 to which the acoustophoresis devices 805 are secured (e.g., coupled using an adhesive or another coupling technique described herein, etc.). In some implementations, the slots 850 or grooves defined in the plate 830 can be formed by coupling one or more rectangular strips of material on the surface of the plate 830, such that the rectangular strips of material are positioned parallel to one another along the length 845 of the plate 830.

In some implementations, the rectangular strips of material coupled to the plate 830 (or defined by one or more slots 850 or grooves in the plate 830, etc.) need not necessarily be rectangular, and may have rounded edges or other features that aid in coupling the plate 830 to the acoustophoresis devices 805 or mounting the plate 830 to a fixture. In some implementations, the acoustophoresis devices 805 (and thus the microfluidic channels 810) can be coupled to the plate 830 using a connector. In such implementations, the acoustophoresis devices 805 can be decoupled from the plate 830. For example, the acoustophoresis devices 805 can be disposable, and thus removable from (and replaceable on) the plate 830 via the connector or another type of attachment mechanism. The portions of the plate 830 can be referred to as 'ribbons,' or 'beams,' which in some implementations might be defined, for example, by narrow plates (e.g., strips of material, etc.) as described herein above. The ribbons (or beams) can correspond well to the equations describing the vibrational modes of beams, or one-dimensional versions of the plate 830. The equation used to describe the dispersion relation for each of the ribbons (or beams) forming the plate 830 is included below:

$$\frac{12\rho}{Eh^2}\omega^2 = \left(\frac{2\pi}{\lambda}\right)^4$$

where $\rho$ is the density of the beam material, h is half the beam thickness 835, and E is the elastic modulus of the beam material. The value of $\lambda$ can represent the wavelength of the standing-mode wave vibrations in the beam, and the value of $\omega$ can represent the frequency of the transducer to which the beams are coupled.

In this case, it can be assumed that the beam width (e.g., the dimension corresponding to the length 845 of the plate 830, etc.) is less than or comparable to the wavelength of the plate modes, so bending of the beam across its width is negligible. The boundary conditions at the ends of the plate 830 can affect the standing mode resonances. For simply supported boundary conditions at the end, the resonances can occur when the width of the plate is equal to a half integer number of wavelengths. However, it should be understood that other boundary conditions, such as fixed boundary conditions or free boundary conditions, are possible. The support of the plate (or the beams, as the case may be) can be chosen to achieve a desired boundary condition. As described herein above, the number, width, thickness, and material type of the ribbons, beams, or slots or grooves defined in the plate 830, can each be selected to conform to the equation described herein above and the desired acoustophoresis frequency for the fluids flowing through the acoustophoresis channels 810, and to the number of acoustophoresis devices 805 used in a particular application (e.g., amount of throughput required, etc.). As shown, the acoustophoresis devices 805 can be positioned such the microfluidic channels 810 run perpendicular to each of the beams defined by the slots 850 in the plate 830.

Referring now to FIG. 5, depicted is a micrograph 500 of a top view of a 4-channel microfluidic device mounted to a plate similar to the plate depicted in FIG. 2, in accordance with one or more implementations. The micrograph 500 shows a plate 530, with multiple microfluidic channels secured thereon. The microfluidic channels can include one or more sidewalls 505 that define a fluid channel edge 550, which is a boundary between the microfluidic channel through which fluids flow and the solid side-walls 505. A fluid, which can contain target particles (here, blood cells), flows through the microfluidic channels in the direction indicated by the flow arrow. In general, any of the microfluidic channels described herein (sometimes referred to herein as acoustophoresis devices or acoustophoresis channels) can have one or more inlets and one or more outlets, and can be coupled to a device that causes fluid to flow through the channels (e.g., a pump or other flow mechanism, etc.). Inlets and outlets of the microfluidic channels described herein allow the channels to be fluidly coupled to other microfluidic structures, such as branch channels, ports, reservoirs, chambers, pumps, or any other type of microfluidic or fluidic structure. The acoustophoresis devices described herein can form a part of a larger microfluidic system, and can be coupled to other microfluidic devices in a batch fluid processing pipeline.

As depicted, the blood cells 520 are acoustically focused in each of the microfluidic channels by the vibrations in the plate 530, which are caused by a transducer (not pictured) coupled to the opposite surface of the plate 530. To yield the results of this example implementations, a single transducer was actuated at about 400 kHz, which generated a vibrational standing wave in the plate 530 that has a frequency tuned to a resonant frequency of the microfluidic channels. The red blood cells 520 are observed to migrate toward the axial stream in all four channels concurrently, which is an improvement over other implementations. Although only four microfluidic channels are depicted herein, it should be understood that other configurations are possible with more or fewer microfluidic channels. The plate 530 can have properties (e.g., material type, width, thickness, etc.) selected to conform the equations above and the number of and the resonant frequency of the microfluidic channels. Other implementations would require that each of the four channels be mounted directly to a specifically selected transducer with a surface area large enough to accommodate them. Thus, using a single transducer, in conjunction with a driving plate 530, is an improvement over traditional acoustophoresis systems, for at least the reasons described herein.

Figure 6:
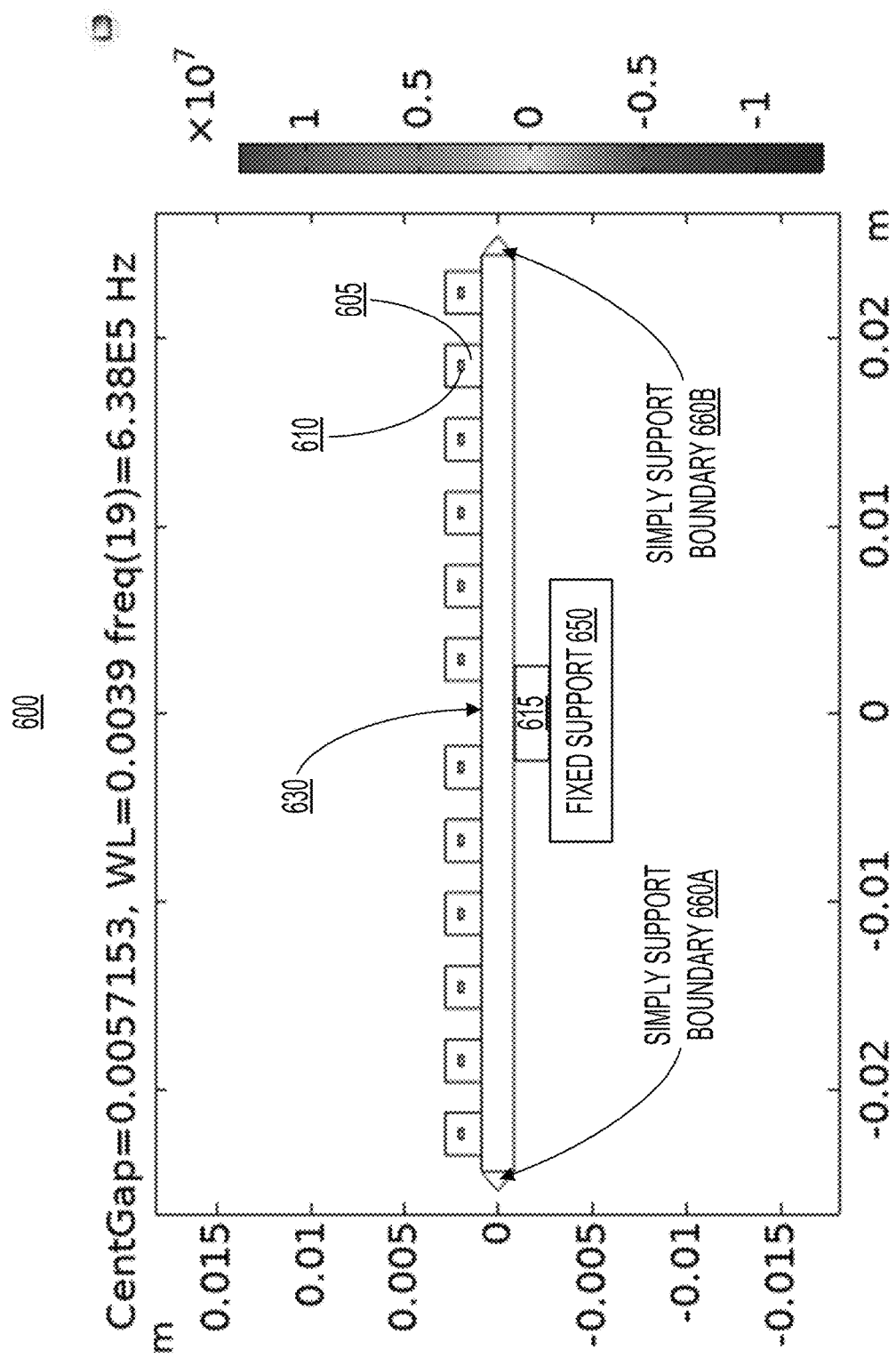
FIG. 6 illustrates an example design of a twelve-channel microfluidic system having a plate similar to the plates depicted in FIG. 2-5, in accordance with one or more implementations.

Referring now to FIG. 6, depicted is a cross section of an example design of a twelve channel microfluidic system 600 having a plate similar to the plate depicted in FIG. 2, in accordance with one or more implementations. The acoustophoresis system 600 can include one or more microfluidic devices 605, with one or more respective microfluidic channels 610 defined therein. The microfluidic channels 610 can be similar to, and have any of the properties of, the microfluidic channels 110 described herein above in conjunction with FIG. 1. The microfluidic devices 605 can each be coupled to the surface of the actuation plate 630, which can have properties (e.g., material type, width, thickness, etc.) selected based on the parameters of the system 600 (e.g., resonant frequency of the channels 610, number of channels 610, properties of transducer 615, etc.) and the equations described herein above. On the surface of the plate 630 opposite to the surface to which the microfluidic devices 605 are coupled, a transducer 615 is secured in the center of the plate 630. In some implementations, the microfluidic devices 605 (and thus the microfluidic channels 610) can be coupled to the plate 630 using a connector. In such implementations, the microfluidic devices 605 can be decoupled from the plate 630. For example, the microfluidic devices 605 can be disposable, and thus removable from (and replaceable on) the plate 630 via the connector or another type of attachment mechanism.

The transducer 615 can be a piezoelectric transducer that can produce vibrational waves in the plate 630 in response to one or more electronic signals. The transducer 615 can be supported by a fixed support 650, which can be any kind of fixed (e.g., preventing motion and rotation, etc.) support that can maintain the position of the transducer 615 as it vibrates. The ends of the plate 630 can be defined by a simply supported boundaries 660A and 660B (sometimes generally referred to as "simply supported boundaries 660" or "simply supported boundary 660"), which can prevent translational motion of the ends of the plate 630 but allow rotational motion of the ends of the plate 630. Put simply, this allows portions of the plate 630 to bend about the boundary points, while maintaining a constant position for the boundary points in space. Having simply supported boundaries 660 on the ends of the plate 630 can simplify the standing wave mode analysis for the plate 630. However, it should be understood that other boundary conditions, such as fixed boundary conditions or free boundary conditions, are possible. The support of the plate (or the beams, as the case may be) can be chosen to achieve a desired boundary condition.

The plate 630 can be designed to drive twelve microfluidic devices 605, each having a microfluidic channel 610 defined therein. The placement of the channels 610 can be determined by the designed standing mode resonance of the plate 630, the wavelength of which is determined by the thickness and stiffness (e.g., elastic modulus of the plate 630 along the width of the plate, etc.) of the plate material. The frequency can be determined by the resonant frequency of the channels 610 necessary to excite the appropriate symmetry of acoustic pressure, and the plate 630 is then designed to optimally drive all channels 610 uniformly with this frequency and with the desired symmetry. In the system 600 depicted in FIG. 6, the desired frequency is 638 kHz and the symmetry is odd for each channel.

The plate 630 can be designed such that the width of a channel 610 is less than half a wavelength of the mode in the plate 630 and the channels are centered on the nodes of the plate mode to achieve the odd symmetry of the driving. As shown, the wavelength of the standing mode wave in the plate 630 is 0.0039 meters (or 3.9 millimeters), and thus the width of each channel can be less than about 1.95 millimeters. In some implementations, the center of the plate 630 opposite the location where the transducer 615 is secured may be larger than other gaps between the microfluidic devices, to accommodate the shape of the standing wave generated in the plate 630. Here, the center gap between the two groups of six microfluidic devices 605 can be about 0.0057153 meters (or 5.7153 millimeters). The frequency of the transducer can be about 638 kHz. The standing wave generated in the plate 630 can have at least twelve nodes, and each of the channels 610 can be positioned on the plate 630 such that the channels 610 are centered on a node of the standing wave in the plate.

Figure 7:
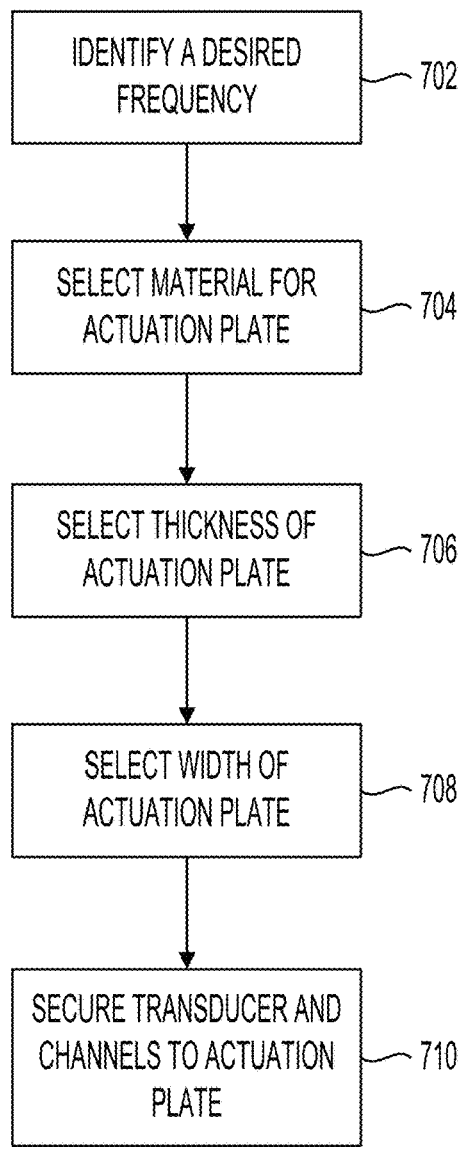
FIG. 7 illustrates a flow diagram of an example method of manufacturing a system similar to those depicted in FIGS. 2, 5, and 6.

Referring now to FIG. 7, depicted is a flow diagram of an example method 700 of manufacturing a system similar to those depicted in FIGS. 2, 3, 5, and 6. The method 700 can be used to manufacture an acoustophoresis system that includes a single transducer that drives multiple acoustophoresis devices using an actuation plate, similar to the plates 230, 330, 430, 530, 630, and 830 described herein in conjunction with FIGS. 2, 3, 4, 5, 6, and 8, respectively. In brief overview, the method 700 can include identifying a desired frequency for a actuation plate (STEP 702), selecting a material for the actuation plate (STEP 704), selecting a thickness of the actuation plate (STEP 706), selecting a width of the actuation plate (STEP 708), and securing a transducer and the channels to the actuation plate (STEP 710).

In brief overview, the method 700 can include identifying a desired frequency for the actuation plate (STEP 702). As described herein, the desired frequency for the actuation plate can be identified as a resonant frequency of a microfluidic channel. In general, the resonant frequency of a microfluidic channel can be a function of the materials that make up the walls of the microfluidic channel and the density of the fluid, or the speed of sound in the fluid, that flows through the microfluidic channels. For example, the optimal microfluidic channel frequency can be based on a ratio of the speed of sound in the material making up the walls of the microfluidic channel to the speed of sound in the fluid that flows through the microfluidic channel. The width of the microfluidic channel can also be used to determine the resonant frequency for a particular microfluidic channel or fluid. However, in general, the dimensions and material properties of the microfluidic channels can define the resonant frequency of those microfluidic channels. Once the resonant frequency of the channel has been identified, STEP 704 of the method 700 can be performed to select a material for the actuation plate.

The method 700 can include selecting a material for the actuation plate (STEP 704). Generally, the plate can be manufactured from any suitable material, such as a metal (e.g., steel, aluminum, etc.), a composite material, or another type of material having a proper elastic modulus along its width. The materials selected for the actuation plate can have a substantially constant elastic modulus along at least two axes of the plate (e.g., an axis corresponding to the thickness of the plate and an axis corresponding to the width of a plate, etc.). In some implementations, the longitudinal mechanical mode of the plate can be altered as desired (e.g., to get a clean waveform such as the waveform depicted in FIG. 4, etc.) by adding asymmetry to the plate through the inclusion of one or more slots or grooves, or by selecting a material having anisotropic properties. The slots or grooves can be defined in the plate, similar to the plate 830 detailed herein in connection with FIG. 8, using any suitable technique, such as etching, milling, drilling, or cutting, among others.

A material having anisotropic properties can be, for example, a uniaxial composite. A uniaxial composite has a first elastic modulus along at least one direction of the plate 230 (e.g., widthwise, etc.), and another elastic modulus along a second direction of the plate (e.g., lengthwise, etc.). The plate 230 can be constructed to have a well-defined mechanical resonance with the desired symmetry and frequency for a standing wave in the plate. This resonance is excited using a transducer as described herein. Generally, materials having a uniform resonance (e.g., constant throughout the material, etc.), and having a high elastic modulus, can be selected for the plate. The plate can be a rectangular actuation plate. In some implementations, the plate can be constructed from a series of beams, similar to the plate 830 described herein above in connection with FIG. 8. The material selected for the plate can have a known density, a known elastic modulus, and a known Poisson ratio.

The method 700 can include selecting a thickness of the actuation plate (STEP 706). It should be understood that, in some implementations, STEPS 706 and 708 can be performed in any order, or in parallel with one another, as the width and thickness of the plate can each affect the properties of the standing wave generated in the plate. The dispersion relation (e.g., the wavelength-frequency relation) for the vibrational standing wave in a rectangular plate can be given by:

$$\lambda^2 = \omega \sqrt{\frac{6\rho(1-\nu^2)}{2h^2 E}},$$

where ρ is the density of the plate material, h is half the plate thickness, E is the elastic modulus of the plate material and ν is the Poisson ratio of the plate material. The Poisson ratio can be a measure of the Poisson effect, which is the phenomenon in which a material tends to expand in directions perpendicular to the direction of compression. The value of λ can represent the wavelength of the standing-mode wave vibrations in the plate, and the value of ω can represent the frequency of the transducer to which the plate is coupled.

In implementations in which the surface of the plate includes one or more beams or strips of material (e.g., defined by one or more grooves or slots, or by material coupled to the surface of the plate, etc.), the values of the widths and thickness of the beams can be given based on the following dispersion relation:

$$\frac{12\rho}{Eh^2}\omega^2 = \left(\frac{2\pi}{\lambda}\right)^4$$

where ρ is the density of the beam material, h is half the beam thickness 335, E is the elastic modulus of the beam material and ν is the Poisson ratio of the beam material. The Poisson ratio can be a measure of the Poisson effect, which is the phenomenon in which a material tends to expand in directions perpendicular to the direction of compression. The value of λ can represent the wavelength of the standing-mode wave vibrations in the beam, and the value of ω can represent the frequency of the transducer to which the beams are coupled. As described herein, the number of beams selected for the plate can be selected based on the material properties of the plate (or beam) material. The number of beams can be selected to satisfy the length of the microfluidic channels that will be coupled to the surface of the plate (which can be made up of beams, as described herein). Said another way, the beams can each have a width that is substantially less than its length (where the length of the beam corresponds to the width of the plate, as described herein). The width of the beams can be selected such that when the length of the beams (width of the plate) is selected in STEP 708, the beams satisfy the above dispersion relation. The number of beams present in the plate can be such that the beams are separated by slots or grooves, but that the number of beams having the selected beam width can uniformly couple along the length of the microfluidic channels coupled to the plate (which can be made up of beams, as described herein).

The equations included above can be solved iteratively to select each of the width and the thickness of the plate (e.g., in conjunction with STEP 708 below, etc.). For example, if the material type has already been selected, then the values for the Poisson ratio, the density, and the elastic modulus of the material will be known. In some implementations, the width of the plate, the thickness of the plate, or the standing wave parameters, can be predetermined (e.g., determined based on application parameters, etc.), and the material of the plate can be selected by determining material that has properties that satisfy the dispersion relationships above. If the values for the material are known, and a general value for the desired wavelength is known (e.g., based on the width of each channel, etc.), then an initial value for the wavelength can be selected to be greater than twice the width of a microfluidic channel that will be coupled to the plate.

Then, by plugging in the values for frequency, wavelength, and material properties, the value of the thickness of the plate can be calculated using the above equation. In some implementations, if the width of the plate is known (e.g., predetermined based on application parameters, etc.), the values of the wavelength can be calculated such that the wavelength is at least twice the width of each of the microfluidic channels. Once this value is calculated, the wavelength (and therefore the width of the plate, etc.) can be modified based to accommodate the number of the microfluidic channels that will be coupled to the plate, and the equation can be solved again for plate thickness. Each of the values can be modified as desired (e.g., to satisfy certain boundary conditions, etc.) until final values for plate width and thickness are achieved.

In some implementations, one or more of the properties of the system can be known or predetermined, which can inform other properties of the system, such as plate width, plate thickness, or plate material. For example, if the number of the microfluidic channels to be placed on the plate are known (e.g., predetermined, determined by required system fluid throughput, etc.), then the wavelength of the standing wave in the plate can be determine based on the number of the microfluidic channels and a width of the actuation plate. Because each of the microfluidic channels can have a width that is less than half of a wavelength of the standing wave, and if the width of the plate can be known (e.g., predetermined based on system application, etc.), an estimate for the wavelength can be determined by dividing half the width of the plate by the desired number of the microfluidic channels. This wavelength can then be used in the equation above, along with known material properties and frequency values, to determine the thickness of the actuation plate for the system.

In implementations where the plate includes one or more beams, similar processes can be used to select the number, width, and thickness of each of the beams or strips of material. The length of the plate can be relatively arbitrary, and can be selected based on the desired length of the acoustophoresis region in the microfluidic system. In general, the length does not directly affect the standing mode wave generated in the plate, but may introduce some issues with longitudinal modes, which can be mitigated using the techniques described herein (e.g., longitudinal modes being coupled from one another using uniaxial materials, beams or strips of material, etc.). Once the material and dimensional properties of the plate have been determined, the plate can be constructed from the desired material using one or more plate construction techniques. The plate construction techniques can include cutting, etching, drilling, milling, injection molding, casting, or any other material manipulation technique that creates a rectangular plate of material having the properties determined above. STEP 708 of the method 700 can be performed to select a width of the actuation plate.

The method 700 can include selecting a width of the actuation plate (STEP 708). The width of the actuation plate can be selected based on the number of, and the width of, each of the microfluidic channels for the system being constructed. Each of the microfluidic channels can be centered on a standing wave node of the standing wave generated in the plate by the transducer, and each of the microfluidic channels can have a width that is less than about half of a wavelength of the standing wave generated in the plate by the transducer when the transducer vibrates at the desired resonant frequency. Thus, the width of the actuation plate can be selected to accommodate the number and the widths of each of the microfluidic channels that will be coupled to the plate to achieve the desired wave characteristics. The selected width of the plate can be, for example, can be used to determine an initial value for the wavelength of the standing mode wave generated in the plate. Because the wavelength is also a function of the thickness of the plate, STEP 706 and STEP 708 can be solved iteratively to achieve a desired wavelength, material width, and material thickness for the plate.

For example, based on a desired number and an initial condition of width of the plate, a value of the wavelength can be determined such that the plate can accommodate a predetermined number of the channels that will be coupled to the plate. This wavelength can be used in the equations described herein below in conjunction with STEP 708 to solve for an initial value for thickness, the values for each of which can be tuned to adjust for any desired boundary condition (e.g., frequency, wavelength, number of standing wave nodes, etc.). In some implementations, and as described in further detail below, the plate can have one or more slots or grooves that define beams or strips of material on the surface of the plate to which the channels will be secured. Each of the beams or strips of material can be selected to have equal widths and heights, according to the equations described herein above. Once the plate has been constructed, STEP 710 of the method 700 can be performed. In some implementations, the method can include selecting a support (e.g., at the ends) for the actuation plate. The supporting structure can be selected to create a desired boundary condition. As described herein, the boundary conditions can include simply supported boundary conditions, fixed boundary conditions, or free boundary conditions. The supporting structure of the plate (or the beams, as the case may be) can be chosen to achieve a desired boundary condition.

The method 700 can include coupling a transducer and the channels to the actuation plate (STEP 710). As described herein, a single transducer can be used to drive one or more channels coupled to the plate that is constructed according to the material properties determined in previous steps of the method 700, as described herein above. The transducer can be coupled to a bottom surface of the actuation plate, and can be coupled in the center of the actuation plate. The transducer can be secured to the actuation plate, for example, using one or more attachment techniques, such as mechanical attachment feature (e.g., one or more clips or brackets, etc.) or using an adhesive compound that is disposed between the actuation plate and the transducer. The adhesive compound can be, for example, a type of epoxy compound that secures the transducer to the plate.

As described herein above, the transducer can be configured to generate a standing wave in the actuation plate that has a frequency that is tuned to a resonant frequency of one or more microfluidic channels. The microfluidic channels can be coupled to the surface of the actuation plate that is opposite the surface to which the transducer is coupled. In some implementations, the microfluidic channels can each be positioned such that they are centered on a respective node of the standing wave that is generated in the actuation plate by the transducer. The microfluidic channels can be secured to the plate using one or more coupling techniques, for example, using an adhesive compound or another type of compound that secures the microfluidic channels to the actuation plate. In some implementations, the microfluidic channels can be coupled to the plate using a connector or another type of attachment mechanism. In such implementations, the microfluidic channels can be decoupled from the plate. For example, the microfluidic channels can be disposable after use, and thus removable from (and replaceable on) the plate via the connector or another type of attachment mechanism.

After the transducer and the microfluidic channels have been secured to the plate, the system can operate by flowing fluid through each of the microfluidic channels, and by providing one or more signals to the transducer that cause the transducer to vibrate at a predetermined frequency. In doing so, the transducer generates a standing wave in the plate according to the parameters determined in previous steps of the method 700, which cause target particles in each of the microfluidic channels to be focused toward the center of each of the microfluidic channels. An example of target particles being focused toward the center of the microfluidic channels is described herein above in conjunction with FIG. 5.

In general, the actuation plate described herein allows for more efficient and concurrent driving of multiple microfluidic channels simultaneously, and without the need for multiple transducers or complex driving electronics. Further, because the standing mode wave has a frequency that is tuned to a resonant frequency of the microfluidic channels, a maximum amount of vibrational energy is transferred to the microfluidic channels in parallel, thereby optimizing the energy transfer from the transducer to the channels. This is an improvement over other implementations, which often use multiple transducers (e.g., which can waste energy and have complex and inefficient driving electronics, etc.), or use a single very large transducer coupled directly to the microfluidic channels (e.g., which can waste vibrational energy and fail to control vibrations along the length of the microfluidic channels, etc.). Thus, the plates described herein, and the design rules for their construction, provide non-obvious improvements over other implementations.

While operations are depicted in the drawings in a particular order, such operations are not required to be performed in the particular order shown or in sequential order, and all illustrated operations are not required to be performed. Actions described herein can be performed in a different order.

The separation of various system components does not require separation in all implementations, and the described program components can be included in a single hardware or software product.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements, and features discussed in connection with one implementation are not intended to be excluded from a similar role in other implementations.

The phraseology and terminology used herein is for the purpose of description and should not be regarded as limiting. The use of "including", "comprising", "having", "containing", "involving", "characterized by", "characterized in that", and variations thereof herein is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

As used herein, the terms "about" and "substantially" will be understood by persons of ordinary skill in the art and will vary to some extent depending upon the context in which they are used. If there are uses of the term which are not clear to persons of ordinary skill in the art given the context in which it is used, "about" will mean up to plus or minus 10% of the particular term.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act, or element may include implementations where the act or element is based at least in part on any information, act, or element.

Any implementation disclosed herein may be combined with any other implementation or embodiment, and references to "an implementation," "some implementations," "one implementation," or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

The indefinite articles "a" and "an," as used herein in the specification and in the claims, unless clearly indicated to the contrary, should be understood to mean "at least one."

References to "or" may be construed as inclusive so that any terms described using "or" may indicate any of a single, more than one, and all the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description, or any claim are followed by reference signs, the reference signs have been included to increase the intelligibility of the drawings, detailed description, and claims. Accordingly, neither the reference signs nor their absence has any limiting effect on the scope of any claim elements.

The systems and methods described herein may be embodied in other specific forms without departing from the characteristics thereof. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. An actuation plate for acoustophoresis devices, comprising:
    a first surface configured to be coupled to an acoustic transducer; and
    a second surface, opposite the first surface, coupled to a plurality of microfluidic channels; and
    one or more slots defining one or more openings through the actuation plate, the one or more openings extending perpendicular to the plurality of microfluidic channels,
    wherein the actuation plate has a thickness selected such that the acoustic transducer generates a standing wave in the actuation plate that concurrently focuses target particles to flow within fluid along a center of each of the plurality of microfluidic channels, and
    wherein the actuation plate is constructed from a material having a first elastic modulus and the plurality of microfluidic channels are each constructed from a second material having a second elastic modulus, different from the first elastic modulus.

2. The actuation plate of claim 1, wherein the one or more slots define one or more beams, each of the one or more beams having a width less than or comparable to a wavelength of the standing wave in the actuation plate.

3. The actuation plate of claim 1, wherein the actuation plate comprises at least one of a composite material, aluminum, steel, brass, tungsten, ceramic, or silicon.

4. The actuation plate of claim 1, wherein a wavelength of the standing wave in the actuation plate further depends on the first elastic modulus of the material; and
    wherein the material is selected such that the wavelength of the standing wave in the actuation plate has a number of standing wave nodes or a number of standing wave antinodes that correspond to a number of the plurality of microfluidic channels.

5. The actuation plate of claim 1, wherein a width of the actuation plate and the thickness of the actuation plate are selected such that a wavelength of the standing wave is large enough to accommodate each of the plurality of microfluidic channels to be positioned on a center of a respective one of a plurality of nodes of the standing wave or a plurality of antinodes of the standing wave.

6. The actuation plate of claim 1, wherein the actuation plate has a width selected such that the standing wave in the actuation plate caused by the acoustic transducer has a plurality of standing wave nodes that each correspond to a position of a respective one of the plurality of microfluidic channels.

7. A method of creating actuation plates for acoustophoresis devices, comprising:
    identifying a desired frequency for an acoustic transducer;
    selecting a width for an actuation plate, a thickness of the actuation plate, and a material for the actuation plate having a first elastic modulus, wherein:
        the thickness is selected such that the acoustic transducer generates a standing wave in the actuation plate that concurrently focuses target particles to flow within fluid along a center of each of a plurality of microfluidic channels; and
        the width is selected such that the standing wave generated in the actuation plate by the acoustic transducer has a plurality of standing wave nodes that each correspond to a position of a respective one of the plurality of microfluidic channels; and
    coupling the acoustic transducer to a first surface of the actuation plate, and coupling the plurality of microfluidic channels to a second surface of the actuation plate, the second surface opposite the first surface.

8. The method of claim 7, further comprising:
    flowing a fluid comprising target particles through at least one of the plurality of microfluidic channels coupled to the actuation plate; and
    generating the standing wave in the actuation plate by actuating the acoustic transducer at the desired frequency.

9. The method of claim 7, further comprising defining one or more grooves or slots in the second surface of the actuation plate prior to securing the plurality of microfluidic channels to the actuation plate.

10. The method of claim 7, further comprising:
    determining a dispersion relation for vibrations in the actuation plate; and
    selecting the material for the actuation plate such that a density of the actuation plate, an elastic modulus of the actuation plate, and a Poisson ratio of the actuation plate satisfy the dispersion relation for the vibrations in the actuation plate.

11. The method of claim 10, further comprising:
    determining a number of microfluidic channels for a microfluidic device;
    determining a wavelength of the standing wave in the actuation plate based on the number of microfluidic channels; and
    wherein determining the dispersion relation for the vibrations in the actuation plate is further based on the wavelength of the standing wave.

12. The method of claim 7, further comprising positioning the plurality of microfluidic channels such that the plurality of microfluidic channels are each positioned on a center of a corresponding one of the plurality of standing wave nodes generated in the actuation plate by the acoustic transducer.

13. The method of claim 7, further comprising positioning the acoustic transducer at a center of the actuation plate.

14. The method of claim 7, further comprising decoupling the plurality of microfluidic channels from the second surface of the actuation plate.

15. A system, comprising:
    an acoustic transducer;
    a plurality of microfluidic channels; and
    an actuation plate comprising:
        a first surface coupled to the acoustic transducer;
        a second surface coupled to the plurality of microfluidic channels, the second surface opposite the first surface; and
        one or more slots defining one or more openings through the actuation plate, the one or more openings extending perpendicular to the plurality of microfluidic channels,
    wherein the actuation plate has a thickness selected such that the acoustic transducer generates a standing wave in the actuation plate that concurrently focuses target particles to flow within fluid along a center of each of the plurality of microfluidic channels.

16. The system of claim 15, wherein each of the plurality of microfluidic channels have a width that is less than half a wavelength of the standing wave in the actuation plate.

17. The system of claim 15, wherein each of the plurality of microfluidic channels are positioned on a center of a respective one of a plurality of nodes or antinodes of the standing wave generated in the actuation plate.

18. The system of claim 15, wherein each of the plurality of microfluidic channels comprise an inlet, and are configured to receive a fluid flow comprising the target particles via the inlet; and
    wherein the acoustic transducer is configured to impart the standing wave in the plurality of microfluidic channels.

19. The system of claim 15, wherein the acoustic transducer is coupled to a center of the first surface of the actuation plate.

20. The system of claim 15, wherein the actuation plate has a width selected such that the standing wave in the actuation plate generated by the acoustic transducer has a plurality of nodes that each correspond to a position of a respective one of the plurality of microfluidic channels.

* * * * *